United States Patent
Zhao

(10) Patent No.: US 10,089,916 B2
(45) Date of Patent: Oct. 2, 2018

(54) FLAT PANEL DISPLAY DEVICE AND SCAN DRIVING CIRCUIT THEREOF

(71) Applicant: Wuhan China Star Optoelectronics Technology Co., Ltd., Wuhan, Hubei (CN)

(72) Inventor: Mang Zhao, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 125 days.

(21) Appl. No.: 15/316,155

(22) PCT Filed: Nov. 4, 2016

(86) PCT No.: PCT/CN2016/104629
§ 371 (c)(1),
(2) Date: Dec. 2, 2016

(87) PCT Pub. No.: WO2018/045625
PCT Pub. Date: Mar. 15, 2018

(65) Prior Publication Data
US 2018/0190179 A1 Jul. 5, 2018

(30) Foreign Application Priority Data
Sep. 12, 2016 (CN) .......................... 2016 1 0817789

(51) Int. Cl.
*G09G 3/20* (2006.01)
*H03K 3/356* (2006.01)

(52) U.S. Cl.
CPC ... *G09G 3/2092* (2013.01); *G09G 2310/0283* (2013.01); *G09G 2310/06* (2013.01); *H03K 3/356017* (2013.01)

(58) Field of Classification Search
CPC .......... G09G 3/2092; G09G 2310/0283; G09G 2310/06; H03K 3/356017
See application file for complete search history.

(56) References Cited

U.S. PATENT DOCUMENTS 6,184,855 B1 * 2/2001 Kobayashi ........... G09G 3/3648
345/100

* cited by examiner

*Primary Examiner* — Sejoon Ahn
(74) *Attorney, Agent, or Firm* — Andrew C. Cheng

(57) ABSTRACT

The disclosure discloses a flat panel display device and a scan driving circuit thereof. The scan driving circuit includes a plurality of cascaded scan drivers, each of the scan drivers includes a forward/backward scanning circuit, an output circuit, a pull-down circuit and a pull-down control circuit, the forward/backward scanning circuit is configured to control the scan drivers to scan forward or backward, the output circuit outputs a first scanning signal, a second scanning signal and a third scanning signal. The first scanning signal, the second scanning signal and the third scanning signal are output by sharing the forward/backward scanning circuit, the pull-down circuit and the pull-down control circuit according to the disclosure, which can reduce the amount of thin film transistors of the scan driving circuit and spare space that are further beneficial for narrow frame design.

8 Claims, 6 Drawing Sheets

FLAT PANEL DISPLAY DEVICE AND SCAN DRIVING CIRCUIT THEREOF

TECHNICAL FIELD

The disclosure relates to a display technical field, and more particularly to a flat panel display device and a scan driving circuit thereof.

DESCRIPTION OF RELATED ART

A conventional flat panel display device adopts a scan driving circuit, which is producing the scan driving circuit on an array substrate by a conventional thin film transistor flat panel display array process to achieve a driving method of scanning line by line.

Each scan driver in a conventional flat panel display device merely drives a scanning line, but each of the scan drivers requires an integral circuit to generate a driving signal, the flat panel display device is generally disposed with multiple scanning lines, which will require to design multiple scanning drivers that cannot be shared, the circuit is too complex and occupied to have a narrow frame design of the flat panel display device.

SUMMARY

The disclosure provides a flat panel display device and a scan driving circuit thereof to solve the problem above.

To solve the technical problem above, the disclosure provides a scan driving circuit, which includes a plurality of cascaded scan drivers, each of the scan drivers includes a forward/backward scanning circuit configured to receive a first scanning control signal, a second scanning control signal, a driving signal and a scanning signal on a next stage as well as outputting a forward/backward control signal, the forward/backward control signal is configured to control the scan drivers to scan forward or backward, an output circuit connected with the forward/backward scanning circuit, configured to receive a first clock signal, a second clock signal, a third clock signal, a fourth clock signal as well as receiving the forward/backward control signal from the forward/backward scanning circuit and outputting a first scanning signal, a second scanning signal and a third scanning signal, a pull-down circuit is connected with the output circuit, configured to pull-up charge or pull-down discharge a first node, a pull-down control circuit is connected with the pull-down circuit, configured to receive the first clock signal and a first voltage reference, configured to control the first node, for pull-down controlling the first scanning signal, the second scanning signal and the third scanning signal.

The output circuit includes a first output circuit, a second output circuit and a third output circuit, the first output circuit outputs the first scanning signal according to the forward/backward control signal, the first clock signal and the second clock signal. The second output circuit outputs the second scanning signal according to the second clock signal, the third clock signal and the first scanning signal. The third output circuit outputs the third scanning signal according to the third clock signal, the fourth clock signal and the second scanning signal.

The forward/backward scanning circuit includes a first controllable switch and a second controllable switch, a control terminal of the first controllable switch receives the first scanning control signal, a first terminal of the first controllable switch receives the driving signal, a second terminal of the first controllable switch and a second terminal of the second controllable switch are connected with the output circuit, a control terminal of the second controllable switch receives the second scanning control signal, a first terminal of the second controllable switch receives the scanning signal on the next stage.

The first output circuit includes a third controllable switch, a fourth controllable switch, a fifth controllable switch and a first capacitor, a control terminal of the third controllable switch receives the first clock signal, a first terminal of the third controllable switch is connected with a second terminal of the second controllable switch and a second terminal of the first controllable switch, a second terminal of the third controllable switch is connected with a first terminal of the fourth controllable switch, a control terminal of the fourth controllable switch receives the first voltage reference, a second terminal of the fourth controllable switch is connected with a first terminal of the first capacitor and a control terminal of the fifth controllable switch, a first terminal of the fifth controllable switch receives the second clock signal, a second terminal of the fifth controllable switch is connected with a second terminal of the first capacitor, and outputting the first scanning signal.

The second output circuit includes a sixth controllable switch, a seventh controllable switch, an eighth controllable switch and a second capacitor, a first terminal of the sixth controllable switch is connected with a second terminal of the first capacitor and a second terminal of the fifth controllable switch, a control terminal of the sixth controllable switch receives the second clock signal, a second terminal of the sixth controllable switch is connected with a first terminal of the seventh controllable switch, a control terminal of the seventh controllable switch receives the first voltage reference, a second terminal of the seventh controllable switch is connected with a first terminal of the second capacitor and a control terminal of the eighth controllable switch, a first terminal of the eighth controllable switch receives the third clock signal, a second terminal of the eighth controllable switch is connected with a second terminal of the second capacitor, and outputting the second scanning signal.

The third output circuit includes a ninth controllable switch, a tenth controllable switch, an eleventh controllable switch and a third capacitor, a first terminal of the ninth controllable switch is connected with a second terminal of the second capacitor, a control terminal of the ninth controllable switch receives the third clock signal, a second terminal of the ninth controllable switch, a first terminal of the tenth controllable switch and a control terminal of the tenth controllable switch receive the first voltage reference, a second terminal of the tenth controllable switch is connected with a first terminal of the third capacitor and a control terminal of the eleventh controllable switch, a first terminal of the eleventh controllable switch receives the fourth clock signal, a second terminal of the eleventh controllable switch is connected with a second terminal of the third capacitor, and outputting the third scanning signal.

The pull-down circuit includes a twelfth controllable switch, a thirteenth controllable switch, a fourteenth controllable switch, a fifteenth controllable switch, a sixteenth controllable switch, a seventeenth controllable switch and a fourth capacitor, a control terminal of the twelfth controllable switch, a control terminal of the thirteenth controllable switch, a control terminal of the fourteenth controllable switch, a control terminal of the fifteenth controllable switch, a control terminal of the sixteenth controllable switch, a control terminal of the seventeenth controllable switch, and a first terminal of the fourth capacitor are connected with the pull-down control circuit, a second terminal of the twelfth controllable switch, a second terminal of the thirteenth controllable switch, a second terminal of the fourteenth controllable switch, a second terminal of the fifteenth controllable switch, a second terminal of the sixteenth controllable switch, a second terminal of the seventeenth controllable switch, and a second terminal of the fourth capacitor receive a second voltage reference, a first terminal of the twelfth controllable switch is connected with a second terminal of the third controllable switch, a first terminal of the thirteenth controllable switch is connected with a second terminal of the first capacitor, a first terminal of the fourteenth controllable switch is connected with a second terminal of the sixth controllable switch, a first terminal of the sixteenth controllable switch is connected with a second terminal of the ninth controllable switch, a first terminal of the seventeenth controllable switch is connected with a second terminal of the first capacitor, a first terminal of the fourteenth controllable switch is connected with a second terminal of the third capacitor.

The pull-down control circuit includes an eighteenth controllable switch, a nineteenth controllable switch, a twentieth controllable switch and a fifth capacitor, a control terminal of the eighteenth controllable switch and a control terminal of the nineteenth controllable switch are connected with a second terminal of the third controllable switch, a second terminal of the eighteenth controllable switch and a second terminal of the nineteenth controllable switch receive the second voltage reference, a first terminal of the eighteenth controllable switch is connected with a second terminal of the fifth capacitor and a control terminal of the twelfth controllable switch, a first terminal of the fifth capacitor receive the first clock signal, a first terminal of the twelfth controllable switch receives the first voltage reference, a second terminal of the twelfth controllable switch and a first terminal of the nineteenth controllable switch are connected with a control terminal of the twelfth controllable switch.

The first voltage reference is a high level, the second voltage reference is a low level.

The first through the twelfth controllable switches are N type thin film transistors, the control terminals, the first terminals and the second terminals of the first through the twelfth controllable switches correspond to gate electrodes, source electrodes and drain electrodes of the N type thin film transistors respectively.

The first through the twelfth controllable switches are P type thin film transistors, the control terminals, the first terminals and the second terminals of the first through the twelfth controllable switches correspond to gate electrodes, source electrodes and drain electrodes of the P type thin film transistors respectively.

To solve the technical problem above, the disclosure further provides a flat panel display device, the flat panel display device includes a scan driving circuit, which includes a plurality of cascaded scan drivers, each of the scan drivers includes a forward/backward scanning circuit configured to receive a first scanning control signal, a second scanning control signal, a driving signal and a scanning signal on a next stage as well as outputting a forward/backward control signal, the forward/backward control signal is configured to control the scan drivers to scan forward or backward, an output circuit is connected with the forward/backward scanning circuit, configured to receive a first clock signal, a second clock signal, a third clock signal, a fourth clock signal as well as receiving the forward/backward control signal from the forward/backward scanning circuit and outputting a first scanning signal, a second scanning signal and a third scanning signal, a pull-down circuit is connected with the output circuit, configured to pull-up charge or pull-down discharge a first node, a pull-down control circuit is connected with the pull-down circuit, configured to receive the first clock signal and a first voltage reference, configured to control the first node, for pull-down controlling the first scanning signal, the second scanning signal and the third scanning signal.

The output circuit includes a first output circuit, a second output circuit and a third output circuit, the first output circuit outputs the first scanning signal according to the forward/backward control signal, the first clock signal and the second clock signal. The second output circuit outputs the second scanning signal according to the second clock signal, the third clock signal and the first scanning signal. The third output circuit outputs the third scanning signal according to the third clock signal, the fourth clock signal and the second scanning signal.

The forward/backward scanning circuit includes a first controllable switch and a second controllable switch, a control terminal of the first controllable switch receives the first scanning control signal, a first terminal of the first controllable switch receives the driving signal, a second terminal of the first controllable switch and a second terminal of the second controllable switch are connected with the output circuit, a control terminal of the second controllable switch receives the second scanning control signal, a first terminal of the second controllable switch receives the scanning signal on the next stage.

The first output circuit includes a third controllable switch, a fourth controllable switch, a fifth controllable switch and a first capacitor, a control terminal of the third controllable switch receives the first clock signal, a first terminal of the third controllable switch is connected with a second terminal of the second controllable switch and a second terminal of the first controllable switch, a second terminal of the third controllable switch is connected with a first terminal of the fourth controllable switch, a control terminal of the fourth controllable switch receives the first voltage reference, a second terminal of the fourth controllable switch is connected with a first terminal of the first capacitor and a control terminal of the fifth controllable switch, a first terminal of the fifth controllable switch receives the second clock signal, a second terminal of the fifth controllable switch is connected with a second terminal of the first capacitor, and outputting the first scanning signal.

The second output circuit includes a sixth controllable switch, a seventh controllable switch, an eighth controllable switch and a second capacitor, a first terminal of the sixth controllable switch is connected with a second terminal of the first capacitor and a second terminal of the fifth controllable switch, a control terminal of the sixth controllable switch receives the second clock signal, a second terminal of the sixth controllable switch is connected with a first terminal of the seventh controllable switch, a control terminal of the seventh controllable switch receives the first voltage reference, a second terminal of the seventh controllable switch is connected with a first terminal of the second capacitor and a control terminal of the eighth controllable switch, a first terminal of the eighth controllable switch receives the third clock signal, a second terminal of the eighth controllable switch is connected with a second terminal of the second capacitor, and outputting the second scanning signal.

The third output circuit includes a ninth controllable switch, a tenth controllable switch, an eleventh controllable switch and a third capacitor, a first terminal of the ninth controllable switch is connected with a second terminal of the second capacitor, a control terminal of the ninth controllable switch receives the third clock signal, a second terminal of the ninth controllable switch, a first terminal of the tenth controllable switch and a control terminal of the tenth controllable switch receive the first voltage reference, a second terminal of the tenth controllable switch is connected with a first terminal of the third capacitor and a control terminal of the eleventh controllable switch, a first terminal of the eleventh controllable switch receives the fourth clock signal, a second terminal of the eleventh controllable switch is connected with a second terminal of the third capacitor, and outputting the third scanning signal.

The pull-down circuit includes a twelfth controllable switch, a thirteenth controllable switch, a fourteenth controllable switch, a fifteenth controllable switch, a sixteenth controllable switch, a seventeenth controllable switch and a fourth capacitor, a control terminal of the twelfth controllable switch, a control terminal of the thirteenth controllable switch, a control terminal of the fourteenth controllable switch, a control terminal of the fifteenth controllable switch, a control terminal of the sixteenth controllable switch, a control terminal of the seventeenth controllable switch, and a first terminal of the fourth capacitor are connected with the pull-down control circuit, a second terminal of the twelfth controllable switch, a second terminal of the thirteenth controllable switch, a second terminal of the fourteenth controllable switch, a second terminal of the fifteenth controllable switch, a second terminal of the sixteenth controllable switch, a second terminal of the seventeenth controllable switch, and a second terminal of the fourth capacitor receive a second voltage reference, a first terminal of the twelfth controllable switch is connected with a second terminal of the third controllable switch, a first terminal of the thirteenth controllable switch is connected with a second terminal of the first capacitor, a first terminal of the fourteenth controllable switch is connected with a second terminal of the sixth controllable switch, a first terminal of the fifteenth controllable switch is connected with a second terminal of the second capacitor, a first terminal of the sixteenth controllable switch is connected with a second terminal of the ninth controllable switch, a first terminal of the seventeenth controllable switch is connected with a second terminal of the third capacitor.

The pull-down control circuit includes an eighteenth controllable switch, a nineteenth controllable switch, a twentieth controllable switch and a fifth capacitor, a control terminal of the eighteenth controllable switch and a control terminal of the nineteenth controllable switch are connected with a second terminal of the third controllable switch, a second terminal of the eighteenth controllable switch and a second terminal of the nineteenth controllable switch receive the second voltage reference, a first terminal of the eighteenth controllable switch is connected with a second terminal of the fifth capacitor and a control terminal of the twentieth controllable switch, a first terminal of the fifth capacitor receives the first clock signal, a first terminal of the twentieth controllable switch receives the first voltage reference, a second terminal of the twentieth controllable switch and a first terminal of the nineteenth controllable switch are connected with a control terminal of the twelfth controllable switch.

The first voltage reference is a high level, the second voltage reference is a low level.

The first through the twentieth controllable switches are N type thin film transistors, the control terminals, the first terminals and the second terminals of the first through the twentieth controllable switches correspond to gate electrodes, source electrodes and drain electrodes of the N type thin film transistors respectively.

The first through the twentieth controllable switches are P type thin film transistors, the control terminals, the first terminals and the second terminals of the first through the twentieth controllable switches correspond to gate electrodes, source electrodes and drain electrodes of the P type thin film transistors respectively.

Beneficial effects of the disclosure are distinguishing from the prior art, the scanning driver of the disclosure includes the forward/backward scanning circuit, the output circuit, the pull-down circuit and the pull-down control circuit, the forward/backward scanning circuit is configured to control the scan driver to scan forward or backward, the output circuit outputs a first scanning signal, a second scanning signal and a third scanning signal. The first scanning signal, the second scanning signal and the third scanning signal are output by sharing the forward/backward scanning circuit, the pull-down circuit and the pull-down control circuit according to the disclosure, which can reduce the amount of thin film transistors of the scan driving circuit and spare space that are further beneficial for narrow frame design.

BRIEF DESCRIPTION OF THE DRAWINGS

In order to more clearly illustrate embodiments of the disclosure, following figures described in embodiments will be briefly introduced, it is obvious that the drawings are merely some embodiments of the disclosure, a person skilled in the art can obtain other figures according to these figures without creativity.

DETAILED DESCRIPTION OF PREFERRED EMBODIMENTS

Embodiments of the disclosure will be described in detail with reference to the accompanying drawings as follows, obviously, the described embodiments are part of embodiments of the disclosure rather than all of them. Based on the embodiments of the disclosure, all other embodiments obtained by a person skilled in the art without creativity should be considered within the scope of protection of the disclosure.

Figure 1:
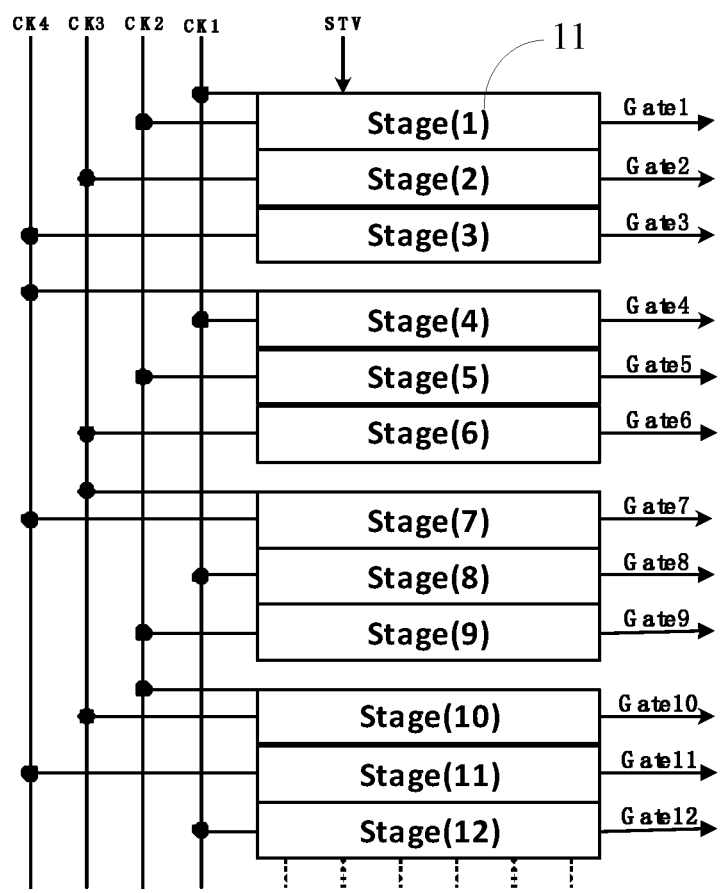
FIG. 1 is a structural schematic view of a scan driving circuit according to a first embodiment of the disclosure.
Figure 2:
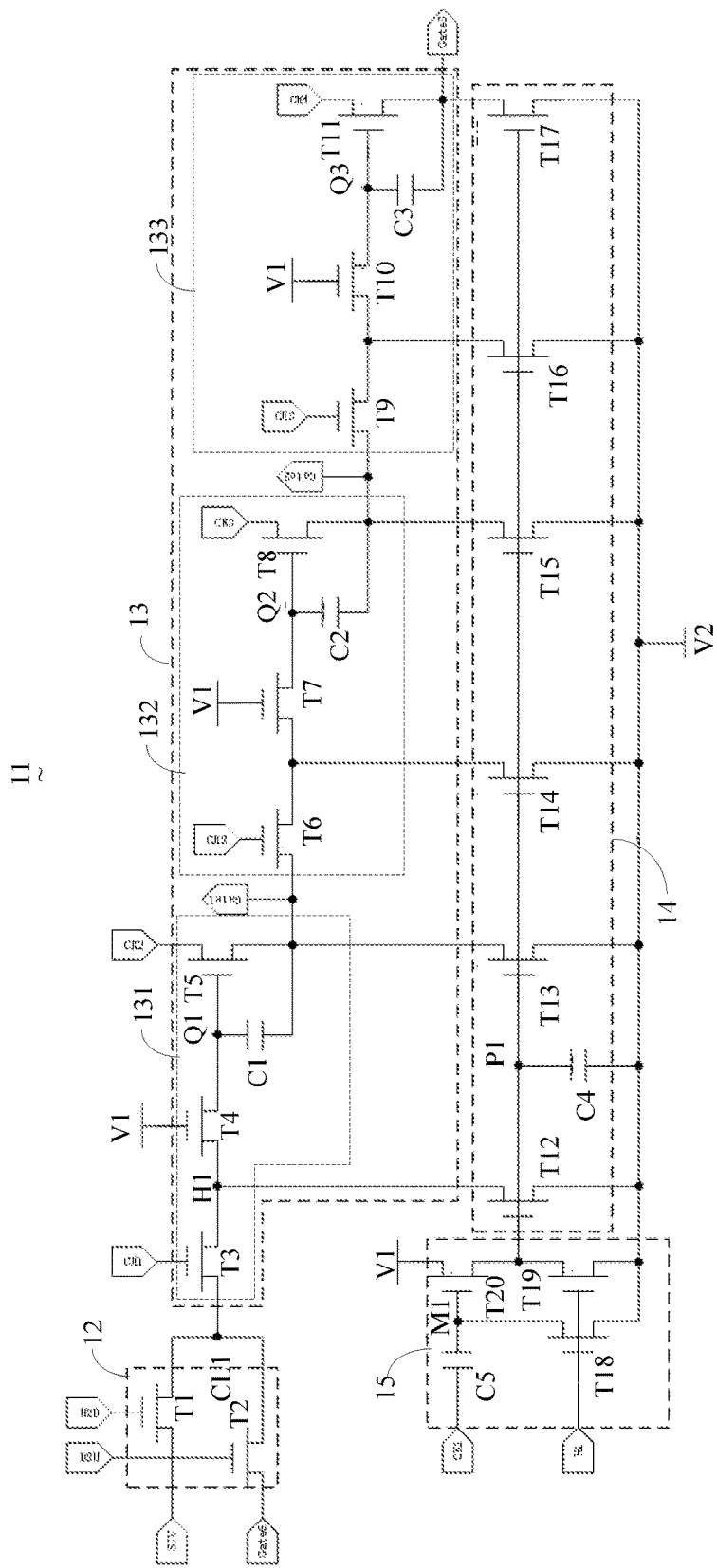
FIG. 2 is a circuit diagram of a scan driver in FIG. 1.

Referring to FIGS. 1-2, FIG. 1 is a structural schematic view of a scan driving circuit according to a first embodiment of the disclosure. FIG. 2 is a circuit diagram of a scan driver in FIG. 1. As shown in FIG. 1, a scan driving circuit 10 disclosed by the embodiment includes a plurality of cascaded scan drivers 11, each of the scan drivers 11 outputs three scanning signals, such as the first scan driver 11 outputs scanning signals Gate1, Gate2 and Gate3. Each of the scan drivers 11 is connected to a first clock signal CK1, a second clock signal CK2, a third clock signal CK3 and a fourth clock signal CK4.

As shown in FIG. 2, each of the scan drivers 11 includes a forward/backward scanning circuit 12, an output circuit 13, a pull-down circuit 14 and a pull-down control circuit 15.

The forward/backward scanning circuit 12 is configured to receive a first scanning control signal up to down (U2D), a second scanning control signal down to up (D2U), a driving signal STV and a scanning signal Gaten+6 on a next stage. The forward/backward scanning circuit 12 outputs a forward/backward control signal CLn according to the first scanning control signal U2D, the second scanning control signal D2U, the driving signal STV and the scanning signal Gaten+6 on the next stage, the forward/backward control signal CLn is configured to control the scan drivers 11 to scan forward or backward.

The output circuit 13 and the forward/backward scanning circuit 12 are connected, the output circuit 13 is configured to receive the first clock signal CK1, the second clock signal CK2, the third clock signal CK3, the fourth clock signal CK4 as well as receiving the forward/backward control signal CLn from the forward/backward scanning circuit 12. The output circuit 13 outputs a first scanning signal Gaten, a second scanning signal Gaten+1 and a third scanning signal Gaten+3.

The pull-down circuit 14 and the output circuit 13 are connected, the pull-down circuit 14 is configured to pull-up charge or pull-down discharge a first node Pn.

The pull-down control circuit 15 and the pull-down circuit 14 are connected, the pull-down control circuit 15 is configured to receive the first clock signal CK1 and a first voltage reference V1, the pull-down control circuit 15 is configured to control the first node Pn according to the first clock signal CK1 and the first voltage reference V1, for pull-down controlling the first scanning signal Gaten, the second scanning signal Gatern+1 and the third scanning signal Gaten+3.

The scan driver 11 on a first stage will be adopted to describe a circuit diagram of the scan drivers 11 as follows.

The output circuit 13 includes a first output circuit 131, a second output circuit 132 and a third output circuit 133, the first output circuit 131 outputs the first scanning signal Gate1 according to the forward/backward control signal CL1, the first clock signal CK1 and the second clock signal CK2. The second output circuit 132 outputs the second scanning signal Gate2 according to the second clock signal CK2, the third clock signal CK3 and the first scanning signal Gate1. The third output circuit 133 outputs the third scanning signal Gate3 according to the third clock signal CK3, the fourth clock signal CK4 and the second scanning signal Gate2.

The forward/backward scanning circuit 12 includes a first controllable switch T1 and a second controllable switch T2, a control terminal of the first controllable switch T1 receives the first scanning control signal U2D, a first terminal of the first controllable switch T1 receives the driving signal STV, a second terminal of the first controllable switch T1 and a second terminal of the second controllable switch T2 are connected with the output circuit 13, a control terminal of the second controllable switch T2 receives the second scanning control signal D2T, a first terminal of the second controllable switch T2 receives the scanning signal Gate6 on the next stage.

The first output circuit 131 includes a third controllable switch T3, a fourth controllable switch T4, a fifth controllable switch T5 and a first capacitor C1, a control terminal of the third controllable switch T3 receives the first clock signal CK1, a first terminal of the third controllable switch T3 is connected with a second terminal of the second controllable switch T2 and a second terminal of the first controllable switch T1, a second terminal of the third controllable switch T3 is connected with a first terminal of the fourth controllable switch T4, a control terminal of the fourth controllable switch T4 receives the first voltage reference V1, a second terminal of the fourth controllable switch T4 is connected with a first terminal of the first capacitor C1 and a control terminal of the fifth controllable switch T5, a first terminal of the fifth controllable switch T5 receives the second clock signal CK2, a second terminal of the fifth controllable switch T5 is connected with a second terminal of the first capacitor C1, and outputting the first scanning signal Gate1. A connection point of the second terminal of the third controllable switch T3 and the first terminal of the fourth controllable switch T4 is a second node H1, a connection point of the first terminal of the first capacitor C1 and the control terminal of the fifth controllable switch T5 is a third node Q1.

The second output circuit 132 includes a sixth controllable switch T6, a seventh controllable switch T7, an eighth controllable switch T8 and a second capacitor C2, a first terminal of the sixth controllable switch T6 is connected with a second terminal of the first capacitor C1 and a second terminal of the fifth controllable switch T5, a control terminal of the sixth controllable switch T6 receives the second clock signal CK2, a second terminal of the sixth controllable switch T6 is connected with a first terminal of the seventh controllable switch T7, a control terminal of the seventh controllable switch T7 receives the first voltage reference V1, a second terminal of the seventh controllable switch T7 is connected with a first terminal of the second capacitor C2 and a control terminal of the eighth controllable switch T8, a first terminal of the eighth controllable switch T8 receives the third clock signal CK3, a second terminal of the eighth controllable switch T8 is connected with a second terminal of the second capacitor C2, and outputting the second scanning signal Gate2. A connection point of the first terminal of the second capacitor C2 and the control terminal of the eighth controllable switch T8 is a fourth node Q2.

The third output circuit 133 includes a ninth controllable switch T9, a tenth controllable switch T10, an eleventh controllable switch T11 and a third capacitor C3, a first terminal of the ninth controllable switch T9 is connected with a second terminal of the second capacitor C2, a control terminal of the ninth controllable switch T9 receives the third clock signal CK3, a second terminal of the ninth controllable switch T9, a first terminal of the tenth controllable switch T10 and a control terminal of the tenth controllable switch T10 receive the first voltage reference V1, a second terminal of the tenth controllable switch T10 is connected with a first terminal of the third capacitor C3 and a control terminal of the eleventh controllable switch T11, a first terminal of the eleventh controllable switch T11 receives the fourth clock signal, a second terminal of the eleventh controllable switch T11 is connected with a second terminal of the third capacitor C3, and outputting the third scanning signal Gate3. A connection point of the first terminal of the third capacitor C3 and the control terminal of the eleventh controllable switch T11 is a fifth node Q3.

The pull-down circuit includes a twelfth controllable switch T12, a thirteenth controllable switch T13, a fourteenth controllable switch T14, a fifteenth controllable switch T15, a sixteenth controllable switch T16, a seventeenth controllable switch T17 and a fourth capacitor C4, a control terminal of the twelfth controllable switch T12, a control terminal of the thirteenth controllable switch T13, a control terminal of the fourteenth controllable switch T14, a control terminal of the fifteenth controllable switch T15, a control terminal of the sixteenth controllable switch T16, a control terminal of the seventeenth controllable switch T17, and a first terminal of the fourth capacitor C4 are connected with the pull-down control circuit, a second terminal of the twelfth controllable switch T12, a second terminal of the thirteenth controllable switch T13, a second terminal of the fourteenth controllable switch T14, a second terminal of the fifteenth controllable switch T15, a second terminal of the sixteenth controllable switch T16, a second terminal of the seventeenth controllable switch T17, and a second terminal of the fourth capacitor C4 receive a second voltage reference V2, a first terminal of the twelfth controllable switch T12 is connected with a second terminal of the third controllable switch T3, a first terminal of the thirteenth controllable switch T13 is connected with a second terminal of the first capacitor C1, a first terminal of the fourteenth controllable switch T14 is connected with a second terminal of the sixth controllable switch T16, a first terminal of the fifteenth controllable switch T15 is connected with a second terminal of the second capacitor C2, a first terminal of the sixteenth controllable switch T16 is connected with a second terminal of the ninth controllable switch T9, a first terminal of the seventeenth controllable switch T17 is connected with a second terminal of the third capacitor C3. A connection point of the control terminal of the twelfth controllable switch T12, the control terminal of the thirteenth controllable switch T13 and the first terminal of the fourth capacitor C4 is a first node P1.

The pull-down control circuit includes an eighteenth controllable switch T18, a nineteenth controllable switch T19, a twentieth controllable switch T20 and a fifth capacitor C5, a control terminal of the eighteenth controllable switch T18 and a control terminal of the nineteenth controllable switch T19 are connected with a second terminal of the third controllable switch T3, a second terminal of the eighteenth controllable switch T18 and a second terminal of the nineteenth controllable switch T19 receive the second voltage reference V2, a first terminal of the eighteenth controllable switch T18 is connected with a second terminal of the fifth capacitor C5 and a control terminal of the twentieth controllable switch T20, a first terminal of the fifth capacitor C5 receives the first clock signal CK1, a first terminal of the twentieth controllable switch T20 receives the first voltage reference V1, a second terminal of the twentieth controllable switch T20 and a first terminal of the nineteenth controllable switch T19 are connected with a control terminal of the twelfth controllable switch T12. A connection point of the first terminal of the eighteenth controllable switch T18, the second terminal of the fifth capacitor C5 and the control terminal of the twentieth controllable switch T20 is a sixth node M1.

Preferably, the first voltage reference V1 is a high level, the second voltage reference V2 is a low level.

Preferably, the first controllable switch T1 through the twentieth controllable switch T20 are N type thin film transistors, the control terminals, the first terminals and the second terminals of the first controllable switch T1 through the twentieth controllable switch T20 correspond to gate electrodes, source electrodes and drain electrodes of the N type thin film transistors respectively.

Figure 3:
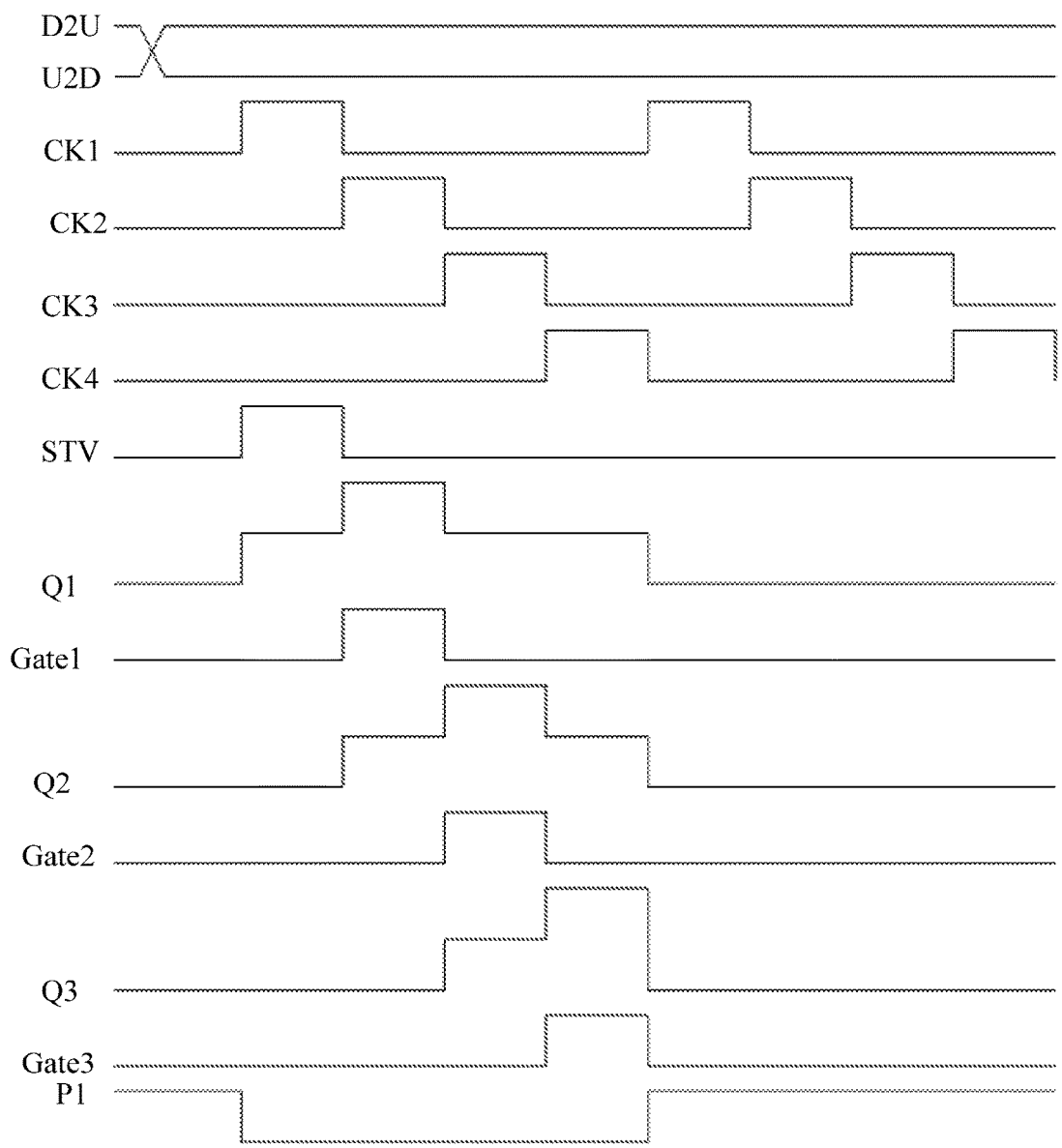
FIG. 3 is a sequence diagram of the scan driving circuit in FIG. 1 during scanning forward.

The operational principle of the scan drivers 11 during scanning forward disclosed in the embodiment will be described in detail with reference to FIG. 3.

When the scan drivers 11 scan forward, the first scanning control signal U2D is a high level, the second scanning control signal D2U is a low level, the first controllable switch T1 is turned on, the second controllable switch T2 is turned off. When a high level pulse signal of the driving signal STV and that of the first clock signal CK1 hit, the second node H1 and the third nod Q1 will be pulled up to a high level, the fifth controllable switch T5, the nineteenth controllable switch T19 and the eighteenth controllable switch T18 are turned on, the sixth node M1 and the first node P1 will be pulled down to a low level, the twentieth controllable switch T20, the twelfth controllable switch T12, the thirteenth controllable switch T13, the fourteenth controllable switch T14, the fifteenth controllable switch T15, the sixteenth controllable switch T16 and the seventeenth controllable switch T17 are turned off.

When a high level pulse signal of the second clock signal CK2 hits, the first scanning signal Gate1 is a high level pulse signal, which can generate a gate driving signal on the first stage. The sixth controllable switch T6 is turned on, the fourth node Q2 is charged to be a high level, the eighth controllable switch T8 is turned on.

When a high level pulse signal of the third clock signal CK3 hits, the second scanning signal Gate2 is a high level pulse signal, which can generate a gate driving signal on the second stage. The ninth controllable switch T9 is turned on, the fifth node Q3 is charged to be a high level, the eleventh controllable switch T11 is turned on.

When a high level pulse signal of the fourth clock signal CK4 hits, the third scanning signal Gate3 is a high level pulse signal, which can generate a gate driving signal on a third stage.

When the high level pulse signal of the first clock signal CK1 hits again, the second node H1 and the third node Q1 will be discharged and pulled down to be a low level, the eighteenth controllable switch T18 and the nineteenth controllable switch T19 are turned off, the sixth node M1 is floatingate, the high level pulse signal of the first clock signal CK1 can cause the sixth node M1 to be lifted to a high level, the twentieth controllable switch T20 is turned on, the first node P1 is charged and pulled up to a high level, the twelfth controllable switch T12, the thirteenth controllable switch T13, the fourteenth controllable switch T14, the fifteenth controllable switch T15, the sixteenth controllable switch T16 and the seventeenth controllable switch T17 are turned on, the third node Q1, the fourth node Q2, the fifth node Q3, the first scanning signal Gate1, the second scanning signal Gate2 and the third scanning signal Gate3 output the low level stably.

Figure 4:
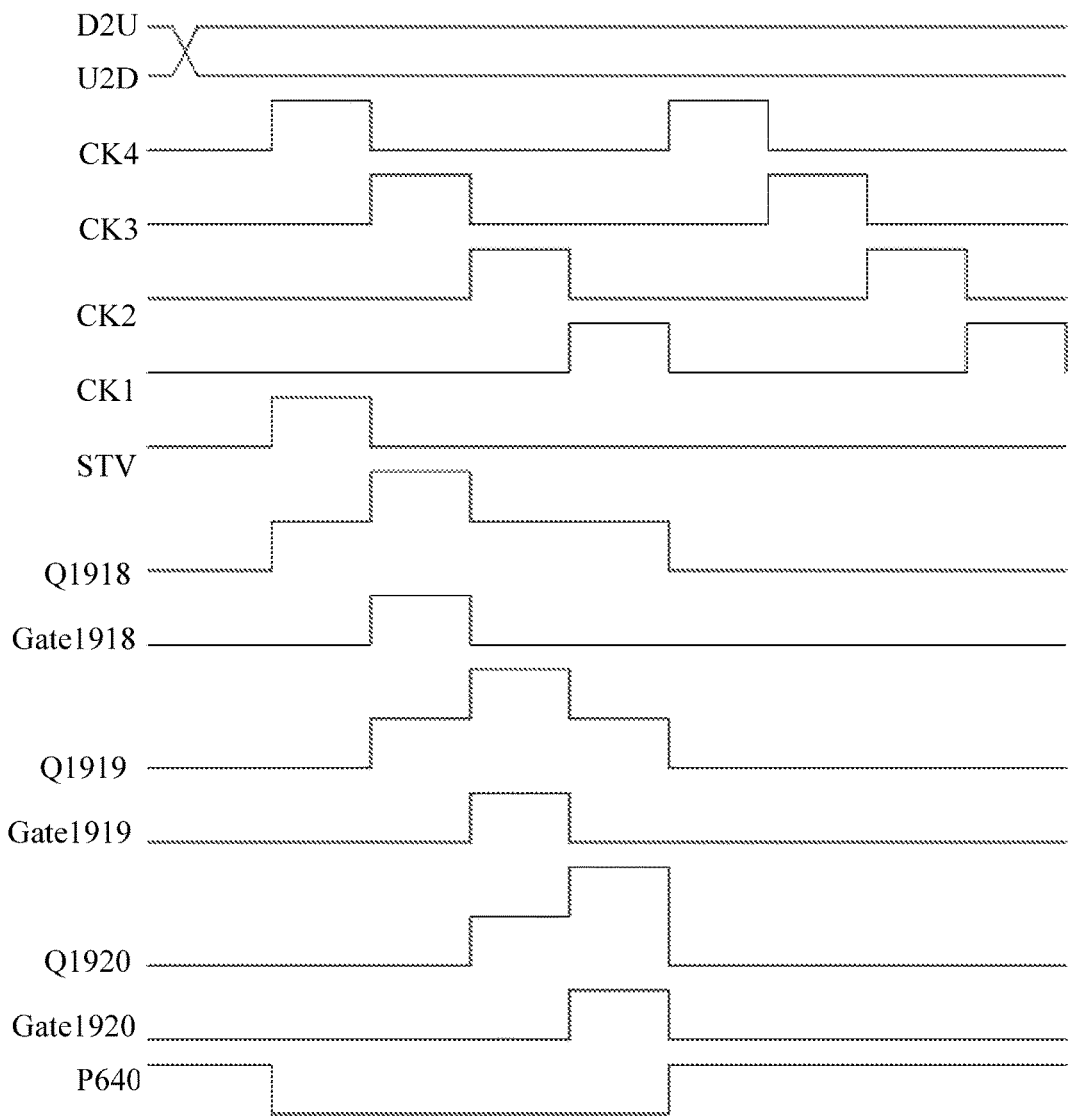
FIG. 4 is a sequence diagram of the scan driving circuit in FIG. 1 during scanning backward.

As shown in FIG. 4, the operational principle of the scan drivers 11 during scanning backward disclosed by the embodiment is similar to the operational principle of the scan drivers 11 during scanning forward above, which will not be repeated.

Figure 5:
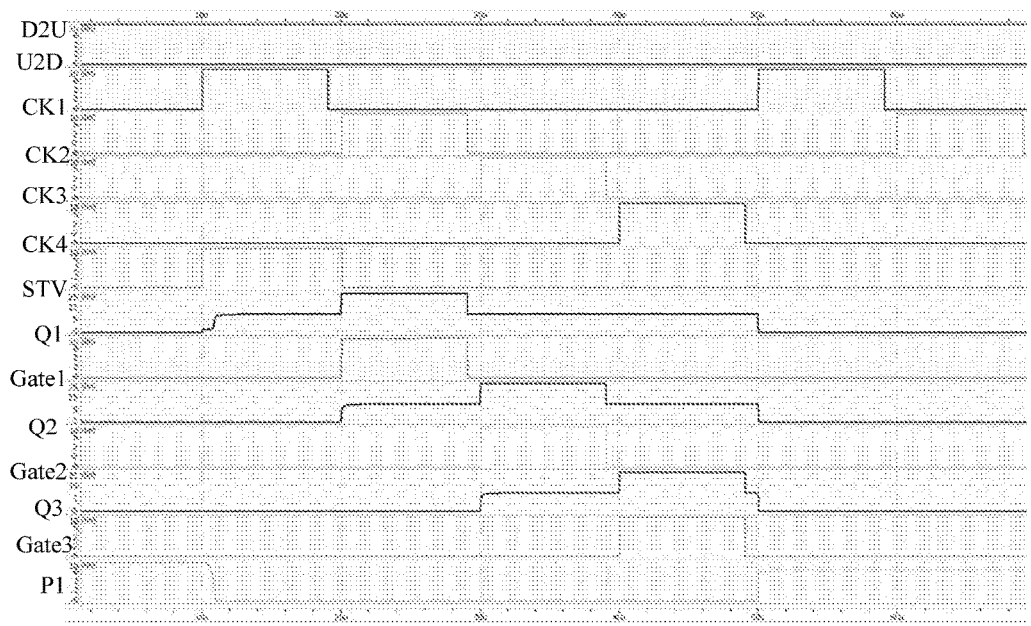
FIG. 5 is a simulation sequence diagram of the scan driving circuit in FIG. 1.

As shown in FIG. 5, functions of the scan driving circuit 10 of the disclosure is identical to the description, which work among multiple cascaded transmission as well.

The first scanning signal Gaten, the second scanning signal Gaten+1 and the third scanning signal Gaten+3 are output by sharing the forward/backward scanning circuit 12, the pull-down circuit 14 and the pull-down control circuit 15 according to the embodiment, which can reduce the amount of thin film transistors of the scan driving circuit 10 and spare space that are further beneficial for narrow frame design.

Figure 6:
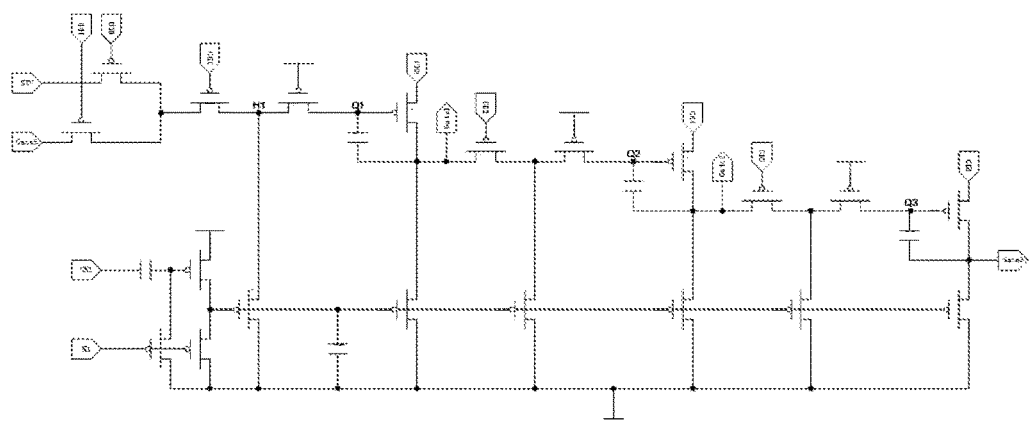
FIG. 6 is a circuit diagram of a scan driver according to a second embodiment of the disclosure.

As shown in FIG. 6, the disclosure further provides a scan driver of a second embodiment, a difference of which compared with the scan drivers 11 disclosed in the first embodiment is that the first through the twentieth controllable switches are P type thin film transistors, the control terminals, the first terminals and the second terminals of the first through the twentieth controllable switches correspond to gate electrodes, source electrodes and drain electrodes of the P type thin film transistors respectively. In other embodiments, the first through the twentieth controllable switches can be other sorts of switches that can achieve the objective of the disclosure.

Figure 7:
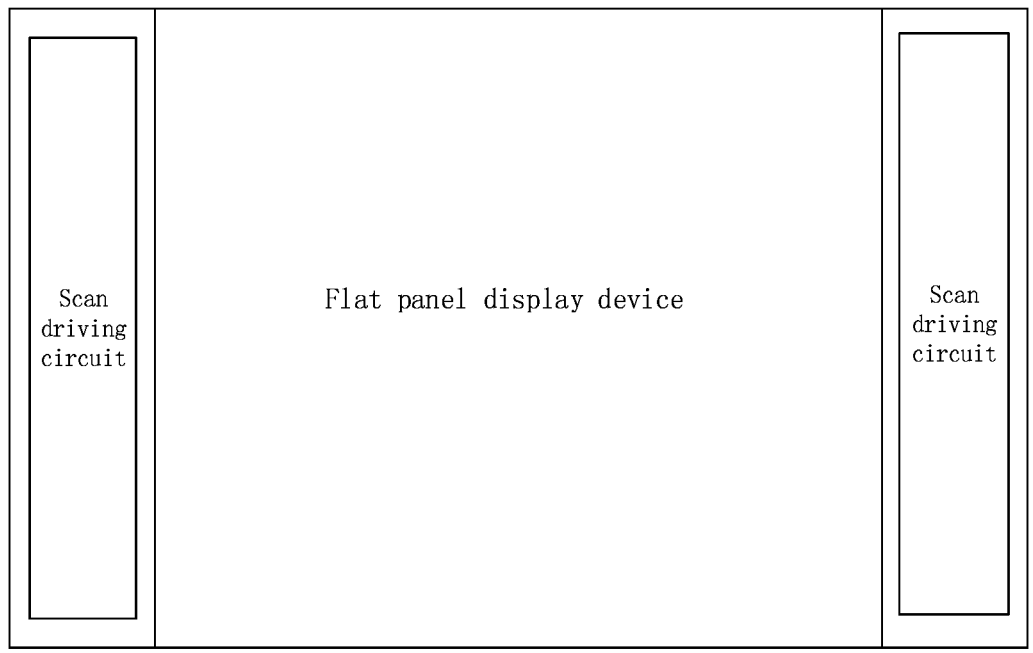
FIG. 7 is a structural schematic view of a flat panel display device according to the first embodiment of the disclosure.

As shown in FIG. 7, the disclosure further provides a flat panel display device of the first embodiment. As shown in FIG. 7, the flat panel display device includes the scan driving circuit mentioned above, the scan driving circuit is disposed on two sides of the flat panel display device. Other components in the flat panel display device and functions thereof are identical to those in a conventional flat panel display device, which will not be repeated. The flat panel display device is a LCD or an OLED.

In summary, the scanning driver of the disclosure includes the forward/backward scanning circuit, the output circuit, the pull-down circuit and the pull-down control circuit, the forward/backward scanning circuit is configured to control the scan driver to scan forward or backward, the output circuit outputs a first scanning signal, a second scanning signal and a third scanning signal. The first scanning signal, the second scanning signal and the third scanning signal are output by sharing the forward/backward scanning circuit, the pull-down circuit and the pull-down control circuit according to the disclosure, which can reduce the amount of thin film transistors of the scan driving circuit and spare space that are further beneficial for narrow frame design.

Above are merely embodiments rather than limitations of the disclosure, any equivalent structure or process according to the disclosure applied in other relative fields directly or indirectly should be covered by the protected scope of the disclosure.

What is claimed is:

1. A scan driving circuit, wherein the scan driving circuit comprises a plurality of cascaded scan drivers, each of the scan drivers comprising:
    a forward/backward scanning circuit, configured to receive a first scanning control signal, a second scanning control signal, a driving signal and a scanning signal on a next stage, as well as outputting a forward/backward control signal, the forward/backward control signal configured to control the scan drivers to scan forward or backward;
    an output circuit, connected with the forward/backward scanning circuit, configured to receive a first clock signal, a second clock signal, a third clock signal, a fourth clock signal as well as receiving the forward/backward control signal from the forward/backward scanning circuit and outputting a first scanning signal, a second scanning signal and a third scanning signal;
    a pull-down circuit, connected with the output circuit, configured to pull-up charge or pull-down discharge a first node;
    a pull-down control circuit, connected with the pull-down circuit, configured to receive the first clock signal and a first voltage reference, configured to control the first node, for pull-down controlling the first scanning signal, the second scanning signal and the third scanning signal,
    wherein the output circuit comprises a first output circuit, a second output circuit and a third output circuit, the first output circuit outputs the first scanning signal according to the forward/backward control signal, the first clock signal and the second clock signal; the second output circuit outputs the second scanning signal according to the second clock signal, the third clock signal and the first scanning signal; the third output circuit outputs the third scanning signal according to the third clock signal, the fourth clock signal and the second scanning signal,
    wherein the forward/backward scanning circuit comprises a first controllable switch and a second controllable switch, a control terminal of the first controllable switch receives the first scanning control signal, a first terminal of the first controllable switch receives the driving signal, a second terminal of the first controllable switch and a second terminal of the second controllable switch are connected with the output circuit, a control terminal of the second controllable switch receives the second scanning control signal, a first terminal of the second controllable switch receives the scanning signal on the next stage,
    wherein the first output circuit comprises a third controllable switch, a fourth controllable switch, a fifth controllable switch and a first capacitor, a control terminal of the third controllable switch receives the first clock signal, a first terminal of the third controllable switch is connected with a second terminal of the second controllable switch and a second terminal of the first controllable switch, a second terminal of the third controllable switch is connected with a first terminal of the fourth controllable switch, a control terminal of the fourth controllable switch receives the first voltage reference, a second terminal of the fourth controllable switch is connected with a first terminal of the first capacitor and a control terminal of the fifth controllable switch, a first terminal of the fifth controllable switch receives the second clock signal, a second terminal of the fifth controllable switch is connected with a second terminal of the first capacitor, and outputting the first scanning signal;
    the second output circuit comprises a sixth controllable switch, a seventh controllable switch, an eighth controllable switch and a second capacitor, a first terminal of the sixth controllable switch connected with a second terminal of the first capacitor and a second terminal of the fifth controllable switch, a control terminal of the sixth controllable switch receives the second clock signal, a second terminal of the sixth controllable switch connected with a first terminal of the seventh controllable switch, a control terminal of the seventh controllable switch receives the first voltage reference, a second terminal of the seventh controllable switch connected with a first terminal of the second capacitor and a control terminal of the eighth controllable switch, a first terminal of the eighth controllable switch receives the third clock signal, a second terminal of the eighth controllable switch connected with a second terminal of the second capacitor, and outputting the second scanning signal;
    the third output circuit comprises a ninth controllable switch, a tenth controllable switch, an eleventh controllable switch and a third capacitor, a first terminal of the ninth controllable switch connected with a second terminal of the second capacitor, a control terminal of the ninth controllable switch receives the third clock signal, a second terminal of the ninth controllable switch, a first terminal of the tenth controllable switch and a control terminal of the tenth controllable switch receive the first voltage reference, a second terminal of the tenth controllable switch connected with a first terminal of the third capacitor and a control terminal of the eleventh controllable switch, a first terminal of the eleventh controllable switch receives the fourth clock signal, a second terminal of the eleventh controllable switch connected with a second terminal of the third capacitor, and outputting the third scanning signal, wherein the pull-down circuit comprises a twelfth controllable switch, a thirteenth controllable switch, a fourteenth controllable switch, a fifteenth controllable switch, a sixteenth controllable switch, a seventeenth controllable switch and a fourth capacitor, a control terminal of the twelfth controllable switch, a control terminal of the thirteenth controllable switch, a control terminal of the fourteenth controllable switch, a control terminal of the fifteenth controllable switch, a control terminal of the sixteenth controllable switch, a control terminal of the seventeenth controllable switch, and a first terminal of the fourth capacitor are connected with the pull-down control circuit, a second terminal of the twelfth controllable switch, a second terminal of the thirteenth controllable switch, a second terminal of the fourteenth controllable switch, a second terminal of the fifteenth controllable switch, a second terminal of the sixteenth controllable switch, a second terminal of the seventeenth controllable switch, and a second terminal of the fourth capacitor receive a second voltage reference, a first terminal of the twelfth controllable switch is connected with a second terminal of the third controllable switch, a first terminal of the thirteenth controllable switch is connected with a second terminal of the first capacitor, a first terminal of the fourteenth controllable switch is connected with a second terminal of the sixth controllable switch, a first terminal of the fifteenth controllable switch is connected with a second terminal of the second capacitor, a first terminal of the sixteenth controllable switch is connected with a second terminal of the ninth controllable switch, a first terminal of the seventeenth controllable switch is connected with a second terminal of the third capacitor, and wherein the pull-down control circuit comprises an eighteenth controllable switch, a nineteenth controllable switch, a twentieth controllable switch and a fifth capacitor, a control terminal of the eighteenth controllable switch and a control terminal of the nineteenth controllable switch are connected with a second terminal of the third controllable switch, a second terminal of the eighteenth controllable switch and a second terminal of the nineteenth controllable switch receive the second voltage reference, a first terminal of the eighteenth controllable switch is connected with a second terminal of the fifth capacitor and a control terminal of the twentieth controllable switch, a first terminal of the fifth capacitor receives the first clock signal, a first terminal of the twentieth controllable switch receives the first voltage reference, a second terminal of the twentieth controllable switch and a first terminal of the nineteenth controllable switch are connected with a control terminal of the twelfth controllable switch.

2. The scan driving circuit according to claim 1, wherein the first voltage reference is a high level, the second voltage reference is a low level.

3. The scan driving circuit according to claim 1, wherein the first through the twentieth controllable switches are N type thin film transistors, the control terminals, the first terminals and the second terminals of the first through the twentieth controllable switches correspond to gate electrodes, source electrodes and drain electrodes of the N type thin film transistors respectively.

4. The scan driving circuit according to claim 1, wherein the first through the twentieth controllable switches are P type thin film transistors, the control terminals, the first terminals and the second terminals of the first through the twentieth controllable switches correspond to gate electrodes, source electrodes and drain electrodes of the P type thin film transistors respectively.

5. A flat panel display device, wherein the flat panel display device comprises a scan driving circuit, the scan driving circuit comprises a plurality of cascaded scan drivers, each of the scan drivers comprising:

a forward/backward scanning circuit, configured to receive a first scanning control signal, a second scanning control signal, a driving signal and a scanning signal on a next stage, as well as outputting a forward/backward control signal, the forward/backward control signal configured to control the scan drivers to scan forward or backward;

an output circuit, connected with the forward/backward scanning circuit, configured to receive a first clock signal, a second clock signal, a third clock signal, a fourth clock signal as well as receiving the forward/backward control signal from the forward/backward scanning circuit and outputting a first scanning signal, a second scanning signal and a third scanning signal;

a pull-down circuit, connected with the output circuit, configured to pull-up charge or pull-down discharge a first node;

a pull-down control circuit, connected with the pull-down circuit, configured to receive the first clock signal and a first voltage reference, configured to control the first node, for pull-down controlling the first scanning signal, the second scanning signal and the third scanning signal, wherein the output circuit comprises a first output circuit, a second output circuit and a third output circuit, the first output circuit outputs the first scanning signal according to the forward/backward control signal, the first clock signal and the second clock signal; the second output circuit outputs the second scanning signal according to the second clock signal, the third clock signal and the first scanning signal; the third output circuit outputs the third scanning signal according to the third clock signal, the fourth clock signal and the second scanning signal, wherein the forward/backward scanning circuit comprises a first controllable switch and a second controllable switch, a control terminal of the first controllable switch receives the first scanning control signal, a first terminal of the first controllable switch receives the driving signal, a second terminal of the first controllable switch and a second terminal of the second controllable switch are connected with the output circuit, a control terminal of the second controllable switch receives the second scanning control signal, a first terminal of the second controllable switch receives the scanning signal on the next stage, wherein the first output circuit comprises a third controllable switch, a fourth controllable switch, a fifth controllable switch and a first capacitor, a control terminal of the third controllable switch receives the first clock signal, a first terminal of the third controllable switch is connected with a second terminal of the second controllable switch and a second terminal of the first controllable switch, a second terminal of the third controllable switch is connected with a first terminal of the fourth controllable switch, a control terminal of the fourth controllable switch receives the first voltage reference, a second terminal of the fourth controllable switch is connected with a first terminal of the first capacitor and a control terminal of the fifth controllable switch, a first terminal of the fifth controllable switch receives the second clock signal, a second terminal of the fifth controllable switch is connected with a second terminal of the first capacitor, and outputting the first scanning signal;

the second output circuit comprises a sixth controllable switch, a seventh controllable switch, an eighth controllable switch and a second capacitor, a first terminal of the sixth controllable switch connected with a second terminal of the first capacitor and a second terminal of the fifth controllable switch, a control terminal of the sixth controllable switch receives the second clock signal, a second terminal of the sixth controllable switch connected with a first terminal of the seventh controllable switch, a control terminal of the seventh controllable switch receives the first voltage reference, a second terminal of the seventh controllable switch connected with a first terminal of the second capacitor and a control terminal of the eighth controllable switch, a first terminal of the eighth controllable switch receives the third clock signal, a second terminal of the eighth controllable switch connected with a second terminal of the second capacitor, and outputting the second scanning signal; the third output circuit comprises a ninth controllable switch, a tenth controllable switch, an eleventh controllable switch and a third capacitor, a first terminal of the ninth controllable switch connected with a second terminal of the second capacitor, a control terminal of the ninth controllable switch receives the third clock signal, a second terminal of the ninth controllable switch, a first terminal of the tenth controllable switch and a control terminal of the tenth controllable switch receive the first voltage reference, a second terminal of the tenth controllable switch connected with a first terminal of the third capacitor and a control terminal of the eleventh controllable switch, a first terminal of the eleventh controllable switch receives the fourth clock signal, a second terminal of the eleventh controllable switch connected with a second terminal of the third capacitor, and outputting the third scanning signal, wherein the pull-down circuit comprises a twelfth controllable switch, a thirteenth controllable switch, a fourteenth controllable switch, a fifteenth controllable switch, a sixteenth controllable switch, a seventeenth controllable switch and a fourth capacitor, a control terminal of the twelfth controllable switch, a control terminal of the thirteenth controllable switch, a control terminal of the fourteenth controllable switch, a control terminal of the fifteenth controllable switch, a control terminal of the sixteenth controllable switch, a control terminal of the seventeenth controllable switch, and a first terminal of the fourth capacitor are connected with the pull-down control circuit, a second terminal of the twelfth controllable switch, a second terminal of the thirteenth controllable switch, a second terminal of the fourteenth controllable switch, a second terminal of the fifteenth controllable switch, a second terminal of the sixteenth controllable switch, a second terminal of the seventeenth controllable switch, and a second terminal of the fourth capacitor receive a second voltage reference, a first terminal of the twelfth controllable switch is connected with a second terminal of the third controllable switch, a first terminal of the thirteenth controllable switch is connected with a second terminal of the first capacitor, a first terminal of the fourteenth controllable switch is connected with a second terminal of the sixth controllable switch, a first terminal of the sixteenth controllable switch is connected with a second terminal of the ninth controllable switch, a first terminal of the seventeenth controllable switch is connected with a second terminal of the first capacitor, a first terminal of the fourteenth controllable switch is connected with a second terminal of the third capacitor, and wherein the pull-down control circuit comprises an eighteenth controllable switch, a nineteenth controllable switch, a twentieth controllable switch and a fifth capacitor, a control terminal of the eighteenth controllable switch and a control terminal of the nineteenth controllable switch are connected with a second terminal of the third controllable switch, a second terminal of the eighteenth controllable switch and a second terminal of the nineteenth controllable switch receive the second voltage reference, a first terminal of the eighteenth controllable switch is connected with a second terminal of the fifth capacitor and a control terminal of the twelfth controllable switch, a first terminal of the fifth capacitor receive the first clock signal, a first terminal of the twelfth controllable switch receives the first voltage reference, a second terminal of the twelfth controllable switch and a first terminal of the nineteenth controllable switch are connected with a control terminal of the twelfth controllable switch.

6. The flat panel display device according to claim 5, wherein the first voltage reference is a high level, the second voltage reference is a low level.

7. The flat panel display device according to claim 5, wherein the first through the twelfth controllable switches are N type thin film transistors, the control terminals, the first terminals and the second terminals of the first through the twelfth controllable switches correspond to gate electrodes, source electrodes and drain electrodes of the N type thin film transistors respectively.

8. The flat panel display device according to claim 5, wherein the first through the twelfth controllable switches are P type thin film transistors, the control terminals, the first terminals and the second terminals of the first through the twelfth controllable switches correspond to gate electrodes, source electrodes and drain electrodes of the P type thin film transistors respectively.

* * * * *